(12) United States Patent
Hada et al.

(10) Patent No.: US 10,178,450 B2
(45) Date of Patent: Jan. 8, 2019

(54) HIGH-SPEED CONVERTER, MEASUREMENT SYSTEM, AND COMPUTER-READABLE MEDIUM

(71) Applicant: FANUC CORPORATION, Yamanashi (JP)

(72) Inventors: Kouji Hada, Yamanashi (JP); Yoshito Miyazaki, Yamanashi (JP); Hideki Otsuki, Yamanashi (JP); Masao Kamiguchi, Yamanashi (JP); Susumu Itou, Yamanashi (JP); Hitoshi Hirota, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/687,817

(22) Filed: Aug. 28, 2017

(65) Prior Publication Data
US 2018/0063606 A1 Mar. 1, 2018

(30) Foreign Application Priority Data
Aug. 31, 2016 (JP) ................................ 2016-169797

(51) Int. Cl.
*H04Q 9/04* (2006.01)
*H03M 1/12* (2006.01)
*H03M 1/66* (2006.01)
*H04L 29/08* (2006.01)
*H04Q 9/02* (2006.01)
*H04Q 9/00* (2006.01)

(52) U.S. Cl.
CPC ................ *H04Q 9/04* (2013.01); *H03M 1/12* (2013.01); *H03M 1/66* (2013.01); *H04L 67/12* (2013.01); *H04Q 9/00* (2013.01); *H04Q 9/02* (2013.01); *H04Q 2209/80* (2013.01); *H04Q 2209/86* (2013.01)

(58) Field of Classification Search
CPC ............................ H04L 67/12; G01M 13/045
USPC .................................................... 340/870.11
See application file for complete search history.

(56) References Cited

U.S. PATENT DOCUMENTS

| 2009/0055678 A1* | 2/2009 | Kummaraguntla | ....... G06F 1/04 713/600 |
| 2010/0328123 A1* | 12/2010 | Imai | ...................... H03M 1/004 341/141 |

(Continued)

FOREIGN PATENT DOCUMENTS

| JP | 4-87170 | 3/1992 |
| JP | 2002-8179 | 1/2002 |

(Continued)

OTHER PUBLICATIONS

Office Action dated Aug. 28, 2018 in Japanese Application No. 2016-169797.

*Primary Examiner* — Fabricio R Murillo Garcia
(74) *Attorney, Agent, or Firm* — Wenderoth, Lind & Ponack, L.L.P.

(57) ABSTRACT

A high-speed converter includes at least one converter among a first converter for converting an analog signal into a digital value; a second converter for converting a digital value into an analog signal; a third converter for converting an electrical signal into a digital signal; and a fourth converter for converting a digital signal into an electrical signal, and causes the at least one converter to operate by a method based on information acquired via a network.

8 Claims, 13 Drawing Sheets

(56) References Cited

U.S. PATENT DOCUMENTS

2015/0188558 A1* 7/2015 Kappes ............... H03M 1/005
                                                                        341/120

2016/0123840 A1    5/2016  Takada et al.

FOREIGN PATENT DOCUMENTS

| | | |
|---|---|---|
| JP | 2004-102828 | 4/2004 |
| JP | 2007-155531 | 6/2007 |
| JP | 2009-245109 | 10/2009 |
| JP | 2014-225080 | 12/2014 |

* cited by examiner

FIG. 5

| MEASUREMENT PATTERN | GUIDANCE | MEASUREMENT/ OUTPUT START | MEASUREMENT/ OUTPUT TIME | MEASUREMENT/ OUTPUT STOP | ANALYSIS SEQUENCE | DA/DO DATA SIGNAL |
|---|---|---|---|---|---|---|
| MEASUREMENT OBJECT 1 | GUIDANCE 1 | INPUT SIGNAL | | INPUT SIGNAL | SQ01 | DA/DO 01 |
| MEASUREMENT OBJECT 2 | GUIDANCE 2 | INPUT SIGNAL | SETTING TIME | TIME UP | SQ02 | DA/DO 02 |
| MEASUREMENT OBJECT 3 | GUIDANCE 3 | SETTING CLOCK TIME | | INPUT SIGNAL | SQ03 | DA/DO 03 |
| MEASUREMENT OBJECT 4 | GUIDANCE 4 | SETTING CLOCK TIME | SETTING TIME | TIME UP | SQ04 | DA/DO 04 |
| MEASUREMENT OBJECT 5 | GUIDANCE 5 | AD LEVEL | | INPUT SIGNAL | SQ05 | DA/DO 05 |
| ... | ... | ... | ... | ... | ... | ... |
| MEASUREMENT OBJECT m | GUIDANCE m | AD LEVEL | SETTING TIME | TIME UP | SQm | DA/DO m |

FIG. 8

PLEASE SELECT ITEM TO MEASURE
[▽]

PLEASE INPUT ID OF EQUIPMENT TO MEASURE

TRANSMIT

FIG. 9

1. SERVO PC BOARD TEST
2. CNC MAIN BOARD TEST
3. DIO CARD TEST
   .
   .
   .
   .

FIG. 15
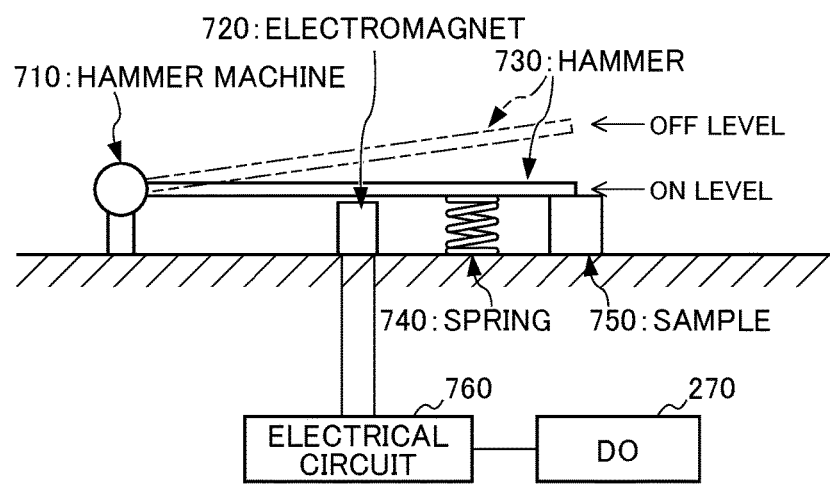
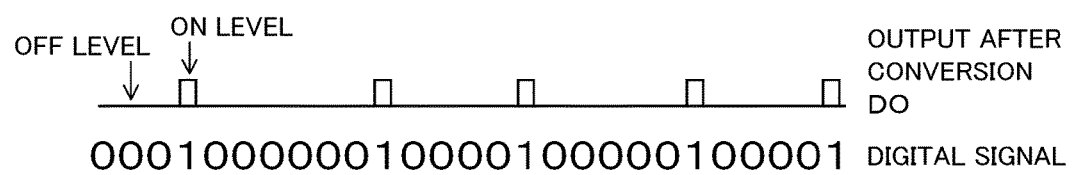

HIGH-SPEED CONVERTER, MEASUREMENT SYSTEM, AND COMPUTER-READABLE MEDIUM

This application is based on and claims the benefit of priority from Japanese Patent Application No. 2016-169797, filed on 31 Aug. 2016, the content of which is incorporated herein by reference.

BACKGROUND OF THE INVENTION

Field of the Invention

The present invention relates to a high-speed converter, measurement system and computer-readable medium for converting signals used in measurement, etc.

Related Art

Configurations of transmitting measurement information measured by sensors to other devices through a network, and using this measurement information in other devices have been proposed in Patent Document 1 and Patent Document 2, for example.

The configuration disclosed in Patent Document 1 includes at least one measurement instrument, a converter that converts an analog signal measured and collected by the measurement instrument into digital data, a data center that stores the digital data converted by this converter as measurement data, and at least one user terminal that performs transfer of desired data with the data center.

On the other hand, Patent Document 2 discloses a monitoring system for diagnosing an abnormal state of a monitoring target, by periodically measuring the state of the monitoring target from a remote location via a network.

Patent Document 1: Japanese Unexamined Patent Application, Publication No. 2002-8179
Patent Document 2: Japanese Unexamined Patent Application, Publication No. 2014-225080

SUMMARY OF THE INVENTION

By employing the aforementioned technologies disclosed in Patent Document 1 and Patent Document 2, it becomes possible to perform monitoring, etc. of a measurement target at a location distanced from the measurement target. However, there have been the following such problems in the technologies disclosed in these patent documents.

For example, with the configuration of Patent Document 1, since the analog signal is converted into digital data, and the conversion results are stored in a data server connected by network, there has been a problem in that processing in a high-speed cycle of at least the network speed is difficult.

In addition, with the configuration of Patent Document 2, for example, in the case of measuring a plurality of measurement targets, it is necessary to install a measurement instrument with communication function compatible with each of the measurement targets. In this point, in order for this measurement instrument with communication function to synchronize, for example, it has been considered to synchronize using a universal timer; however, it has been difficult to synchronize with high precision by this method. For this reason, it has been considered to synchronize by making communication via a network; however, since it becomes dependent on the network speed with this method, there has been a problem in that processing at a high-speed cycle of at least the network speed is still difficult.

Therefore, the present invention has an object of providing a high-speed converter, measurement system and high-speed conversion program capable of performing processing at higher-speed cycles.

According to a first aspect of the present invention, a high-speed converter (e.g., the high-speed converter 220 described later) includes at least any conversion means among a first conversion means (e.g., the A/D 241 described later) for converting an analog signal into a digital value; a second conversion means (e.g., the D/A 251 described later) for converting a digital value into an analog signal; a third conversion means (e.g., the DI 261 described later) for converting an electrical signal into a digital signal; and a fourth conversion means (e.g., the DO 271 described later) for converting a digital signal into an electrical signal, in which the conversion means that is included is operated by a method based on information (e.g., the measurement pattern 342 and data file 343 described later) acquired via a network (e.g., the network 400 described later).

According to a second aspect of the present invention, the high-speed converter as described in the first aspect may further include: a plurality of conversion means among the first conversion means, the second conversion means, the third conversion means and the fourth conversion means; and a clock generating means (e.g., the clock generation circuit 222 described later) for generating a clock, in which the plurality of conversion means that are comprised may be operated synchronously based on the clock outputted from the clock generating means.

According to a third aspect of the present invention, the high-speed converter as described in the first or second aspect may be configured so that the information acquired via the network at least includes data for measuring a measurement object, and any of the conversion means that is comprised converts and outputs the data for measuring, while a conversion means other than said conversion means converts data inputted from a measurement instrument that is measuring the measurement object.

According to a fourth aspect of the present invention, the high-speed converter as described in the third aspect may be configured so that the information acquired via the network further includes a condition for starting measurement on the measurement object and a condition for ending measurement on the measurement object, and measurement on the measurement object is started on the event of the condition for starting being satisfied, and subsequently the measurement on the measurement object is ended on the event of the condition for ending being satisfied.

According to a fifth aspect of the present invention, the high-speed converter as described in the third or fourth aspect may be configured so that the data for measuring the measurement object is data for inducing a predetermined phenomenon in the measurement object.

According to a sixth aspect of the present invention, the high-speed converter as described in the third or fourth aspect may be configured so as to be capable of connecting and disconnecting the measurement instrument and switching to another measuring instrument.

According to a seventh aspect of the present invention, a measurement system includes the high-speed converter as described in any one of the first to sixth aspects, and an analysis server (e.g., the analysis server 300 described later) that is connected to the high-speed converter via a network, in which the analysis server transmits at least data for measuring a measurement object (e.g., the measurement object 100 described later) to the high-speed converter as the information acquired via the network, the high-speed converter measures the measurement object by causing conversion to be performed in the conversion means that is comprised based on the data for measuring the measurement object, and transmits data acquired from the measurement to the analysis server, and the analysis server performs analysis on the measurement object based on the data acquired from the measurement.

According to an eighth aspect of the present invention, the measurement system as described in the seventh aspect may be configured so that the analysis server outputs guidance information corresponding to a type of the measurement object, the guidance information being referenced by a user in order to perform measurement.

According to a ninth aspect of the present invention, a high-speed conversion program enables a computer, which is equipped with at least any conversion means among a first conversion means (e.g., the A/D 241 described later) for converting an analog signal into a digital value; a second conversion means (e.g., the D/A 251 described later) for converting a digital value into an analog signal; a third conversion means (e.g., the DI 261 described later) for converting an electrical signal into a digital signal; and a fourth conversion means (e.g., the DO 271 described later) for converting a digital signal into an electrical signal, to function as a high-speed converter (e.g., the high-speed converter 220 described later), in which the high-speed conversion program causes the computer to function as high-speed converter which causes the conversion means that is equipped to operate by a method based on information acquired via a network (e.g., the network 400 described later).

According to the present invention, it becomes possible to perform processing at higher-speed cycles.

BRIEF DESCRIPTION OF THE DRAWINGS

FIG. 5 is a table representing an example of a measurement pattern according to the embodiment of the present invention;

FIG. 8 is a view (2/6) representing an example of a user interface according to the embodiment of the present invention;

FIG. 9 is a view (3/6) representing an example of a user interface according to the embodiment of the present invention;

FIG. 15 is a view representing an example applying the embodiment of the present invention to a device driving a hammer;

DETAILED DESCRIPTION OF THE INVENTION

Figure 1:
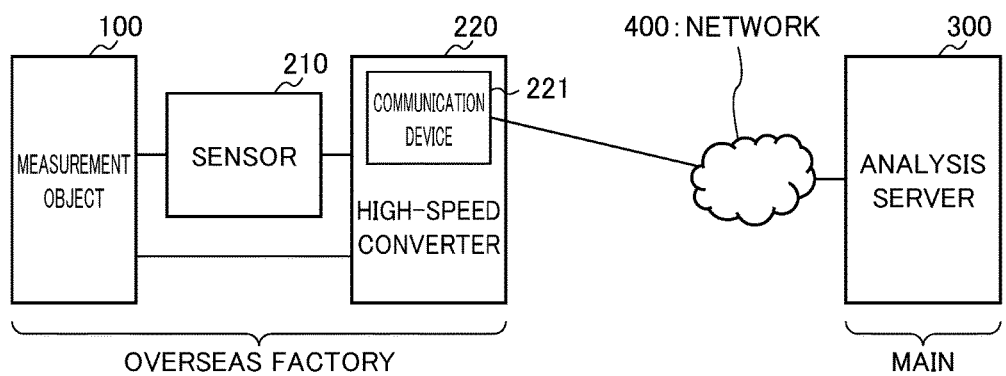
FIG. 1 is a diagram representing the basic configuration of the overall embodiment of the present invention.

Next, an embodiment of the present invention will be explained in detail by referencing the drawings. First, the configuration of the present embodiment overall will be explained by referencing FIG. 1. When referencing FIG. 1, the present embodiment includes a measurement object 100, sensor 210, high-speed converter 220 and analysis server 300. The analysis server 300 is installed in the factory of the headquarters, for example. On the other hand, the measurement object 100, sensor 210 and high-sped converter 220 are installed in an overseas factory constructed in a different country from the headquarters, for example. However, since a communication device 221 inside of the high-speed converter 220 and the analysis server 300 are connected via a network 400, the high-speed converter 220 and analysis server 300 are able to perform communication even if installed at remote locations such as different countries.

The measurement object 100 shall be the target for measurement in the present embodiment, and is a machine tool, for example. In more detail, it is a drive device of a machine tool, control circuit board for controlling a machine tool, or the like. In addition, the measurement object 100 may otherwise be an article defined as a machining target by the machine tool, for example.

The sensor 210 is a sensor for measuring a phenomenon in the measurement object 100. The measurement object 100, for example, is a sensor such as a vibration sensor, pressure sensor, voltage sensor, sound sensor, temperature sensor, acceleration sensor, or an optical or ultrasonic sensor for detecting an article. However, this measurement object 100 or sensor 210 is ultimately just an exemplification, and the present embodiment may be configured with other matters related to such a factory defined as the measurement object 100. In addition, it may be configured so as to define a sensor other than that exemplified as the sensor 210.

The high-speed converter 220 is connected with the sensor 210, measurement object 100, and analysis server 300, and sends/receives signals with these. More specifically, the high-speed converter 220 receives test data for performing measurement from the analysis server 300. Then, the high-speed converter 220 controls the measurement object 100 by way of outputting signals based on the test data to the measurement object 100. In addition, the sensor 210 measures the change in state of the measurement object 100 relative to this control, and transmits measurement results to the high-speed converter 220. The high-speed converter 220 converts the received measurement results to the change in digital value or digital signal, and transmits to the analysis server 300. The analysis server 300 is thereby able to analyze the measurement object 100 relative to test data by the change in digital value or digital signal.

It should be noted that, in the drawings, although one of each of the measurement object 100, sensor 210 and high-speed converter 220 are illustrated, the relationships thereof are not necessary 1:1. For example, a plurality of the measurement objects 100 and/or a plurality of the sensors 210 may be connected to one high-speed converter 220. In addition, for example, it may be configured so as to perform measurement by way of a plurality of sensors 210 relative to one measurement object 100. Furthermore, a plurality of existing measurement objects 100 may respectively be different types, and the plurality of existing sensors 210 may be sensors of respectively different types.

Figure 2:
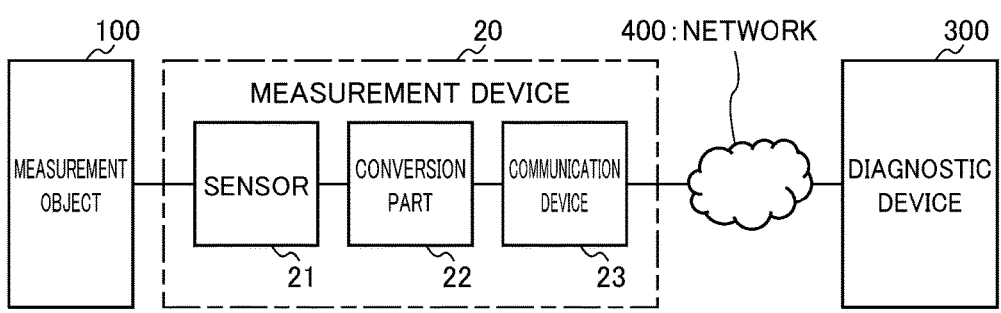
FIG. 2 is a diagram representing the basic configuration including a general measurement apparatus.

Next, in order to compare with the present embodiment, the configuration of a common measurement apparatus is shown in FIG. 2. As shown in FIG. 2, the measurement apparatus 20 that is the common measurement apparatus is realized as one apparatus including a sensor 21, conversion part 22 and communication device 23. In the case of configuring in this way, it is necessary to completely replace the entirety of the measurement apparatus 20 if the sensor 21 fails. On the other hand, as mentioned above, the high-speed converter 220 of the present embodiment is a configuration that can externally connect a plurality of sensors 210 which electrically convert phenomena in the measurement object 100. For this reason, even if the connected sensor 210 failed, it is sufficient to connect another new sensor 210 to the high-speed converter 220, and it is not necessary to replace, etc. other than the sensor 210.

In this point, it is often the case that such sensors as the sensor 21 or sensor 210 electrically converting phenomena in the measurement object generally directly physically contact the subject of the measurement object, and the possibility of failing is also high. However, in the present embodiment, even if assuming that the sensor 210 failed, it is sufficient to simply replace the sensor 210 as mentioned above, and compared to a general configuration which requires to replace the entirety of the measurement apparatus 20 during failure of the sensor 21, it is possible to make the running cost economical.

In addition, in the case of the conversion part 22 or communication device 23 failing with the general configuration, even if the sensor 21 has not failed, for example, the entirety of the measurement apparatus 20 including the sensor 21 will be replaced. However, in the present embodiment, it is unnecessary to replace the sensor 210 in the case of the high-speed converter 220 failing. In other words, it is also possible to lower the frequency of replacing sensors. In this point, since generally the sensors such as the sensor 21 and sensor 210 which electrically convert phenomena in the measurement object are often expensive, it is possible to make the running cost economical also by the replacement frequency of sensors declining in this way.

Furthermore, in the present embodiment, since freedom in the combination with sensors is made possible, it is possible to raise the degrees of freedom in the case of constructing a system.

Figure 3:
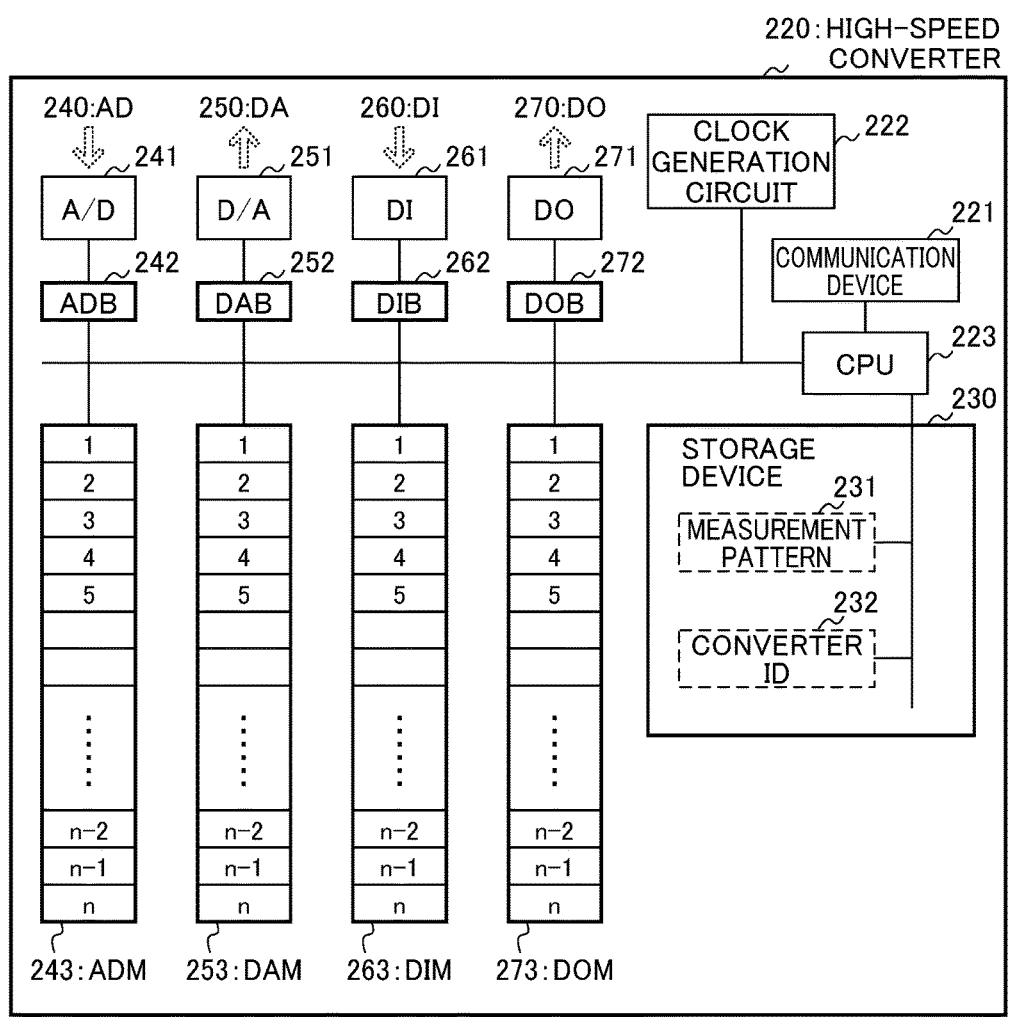
FIG. 3 is a diagram representing the basic configuration of a high-speed converter according to an embodiment of the present invention.

Next, a specific configuration of the inside of the high-speed converter 220 will be explained by referencing FIG. 3. The high-speed converter 220 includes a communication device 221, clock generation circuit 222, CPU 223, storage device 230, AD 240, A/D 241, ADB 242, ADM 243, DA 250, D/A 251, DAB 252, DAM 253, DI 260, DI 261, DIB 262, DIM 263, DO 270, DO 271, DOB 272 and DOM 273.

The communication device 221 is a communication device for performing communication with the analysis server 300 via the network 400.

The clock generation circuit 222 is a circuit for generating a clock offered to each part operating inside of the high-speed converter 220. The CPU 223 controlling each part within the high-speed converter 220 can synchronize each part by controlling each part within the high-speed converter 220 based on the clock supplied from the clock generation circuit 222. In the following explanation, the matter of the clock supplied from the clock generation circuit 222 will be referred to as "reference clock".

The CPU 223 is a device controlling the entirety of the high-speed converter 220. In more detail, the CPU 223 reads information such as a control program stored in the storage device 230, etc., and performs arithmetic processing based on the information such as the control program thus read, etc. Then, by the CPU 223 controlling the hardware within the high-speed converter 220 based on arithmetic processing, the respective processing of the high-speed converter 220 is realized. In other words, the high-speed converter 220 can be realized by software and hardware cooperating.

The storage device 230 is a device that stores a variety of information, and stores the measurement pattern 231 and converter ID 232, for example. The measurement pattern 231 is data representing a pattern for performing measurement by way of the high-speed converter 220. The specific contents of the measurement pattern 231 will be described later by referencing FIG. 5. In addition, the converter ID 232 is an identifier for identifying the high-speed converter 220. The analysis server 300 configures so as to only connect with a high-speed converter 220 permitted by authentication using this converter ID 232. The data thereof is acquired from the analysis server 300. However, it may be configured so that the converter ID 232 is stored in advance during manufacture of the high-speed converter 220, for example.

The AD 240 is an analog signal expressing a phenomenon in the measurement object 100, and is outputted by the sensor 210 measuring the measurement object 100. The AD 240 outputted by the sensor 210 is inputted to the A/D 241. If the sensor 210 is a vibration sensor, for example, the AD 240 is an oscillatory waveform expressing the magnitude of vibration.

The A/D 241 is an analog-digital converter that converts the AD 240 which is the inputted analog signal into a digital value. Herein, the converted digital value is represented by the digital signal of predetermined bits. The A/D 241 performs conversion at the cycle of the reference clock according to control of the communication device 221, and outputs the digital signal of predetermined bits representing the digital value obtained by conversion to the ADB 242 which is a temporary storage unit to be temporarily stored as sampling data. The CPU 223 can reference the sampling data inputted to the ADB 242 at a predetermined high-speed cycle (for example, cycle on the order of 10 µs) based on a reference bit.

In addition, the ADM 243, which is a storage device for storing sampling data sampled at high speed in this way, is connected to the ADB 242. Then, the CPU 223 transfers the sampling data temporarily stored in the ADB 242 at a timing based on the measurement pattern 231 to the ADM 243 at a sequential high-speed period to be stored in the ADM 243. The counters for the ADM 243, and the DAM 253, DIM 263 and DOM 273 described later, which are other storage devices, are controlled by the reference clock by the CPU

223. It should be noted that these storage devices have n number of storage regions (n being any natural number). For this reason, it is possible to change following a time series and save n-number of sampling data in these storage devices. It should be noted that n shall be 2000, for example.

The DAM 253 stores continuous data for controlling the measurement object 100. This continuous data is associated with the measurement pattern 231. It should be noted that this continuous data and measurement pattern 231 shall be received from the analysis server 300 in advance, and stored in the storage device 230 and/or DAM 253. The CPU 223 in number order reads the continuous data stored by the DAM 253 at a timing based on the measurement pattern 231, and temporarily stores in the DAB 252. In addition, the continuous data stored in DAB 252 is outputted to the D/A 251. Herein, the continuous data is outputted as a digital signal of predetermined bits representing the digital value.

The D/A 251 is a digital-analog converter that converts the digital signal of predetermined bits representing the digital values inputted into an analog signal. The D/A 251 performs conversion at the cycles of the reference clock according to the control of the communication device 221, and outputs the analog signal obtained by conversion to outside continuously as the DA 250. The DA 250 is outputted as a test waveform for testing the measurement object 100, for example. In addition, the output destination of the DA 250 is the measurement object 100. However, for example, if the measurement object 100 is an article such that is machined by the machine tool, it may be configured so as to output the DA 250 to this machine tool.

By simultaneously using the AD 240 and DA 250 while performing high-speed conversion in this way, it is possible to output the data for measurement or testing from the DA 250 to the measurement object 100, measure the response of electrical change in the measurement object 100 relative to the output at the AD 240, and store the digital value for which the response is synchronized with the output. For example, it becomes possible to convert the position information of the machine tool into an electrical signal, and monitor other phenomena synchronized with the positional information of the machine tool at high speed. In addition, each part within the high-speed converter 220 is controlled by the CPU 223 operated at the reference clock as mentioned above. For this reason, for example, a plurality of groups consisting of the A/D 241, ADB 242 and ADM 243 are provided, and even in the case of a sensor 210 being connected to each of this plurality of groups, synchronization of the transfer period is maintained by the CPU 223.

Next, the DI 261, DIB 262, and DIM 263, as well as DO 271, DOB 272 and DOM 273 will be explained. The operations of each of these parts resemble the aforementioned A/D 241, ADB 242 and ADM 243, as well as D/A 251, DAB 252 and DAM 253. However, since the data handled as the conversion target differs, this point will be explained in entirety, and otherwise redundant explanations will be omitted.

The DI 260 is an electrical signal representing a phenomenon in the measurement object 100, and is outputted by the sensor 210 measuring the measurement object 100. The DI 260 outputted by the sensor 210 is inputted to the DI 261. The DI 260, for example, is a square wave representing 0 or 1.

The DI 261 converts the measurement object 100 which is the inputted electrical signal into a digital signal expressing 0 or 1. The DI 261 performs conversion at the cycle of the reference clock according to the control of the communication device 221, and outputs the digital signal obtained by conversion to the DIB 262 which is a temporary storage unit to be temporarily stored as sampling data. The CPU 223 can reference the sampling data inputted to the DIB 262 at a predetermined high-speed cycle based on a reference bit.

In addition, the DIM 263, which is a storage device for storing the sampling data sampled at high speed in this way, is connected to the DIB 262. Then, the CPU 223 transfers the sampling data temporarily stored in the DIB 262 at a timing based on the measurement pattern 231 described later to the DIM 263 at a high-speed cycle sequentially to be stored in the DIM 263.

The continuous data for controlling the measurement object 100 is stored in the DOM 273. This continuous data is associated with the measurement pattern 231. It should be noted that this continuous data and measurement pattern 231 shall be received in advance from the analysis server 300, and stored in the storage device 230 and/or DOM 273. The CPU 223 reads in number order the continuous data stored by the DOM 273 at the timing based on the measurement pattern 231 and causes to temporarily store in the DOB 272. In addition, the continuous data stored in the DOB 272 is outputted to the DO 271. Herein, the continuous data is outputted as a digital signal expressing 0 or 1.

The DO 271 converts the inputted digital signal to make into an electrical signal corresponding to 0 or 1.

The DO 271 performs conversion at the cycle of the reference clock according to the control of the communication device 221, and outputs the electrical signal obtained by conversion to outside continuously as the DO 270. The DO 270, for example, if the measurement object 100 is a hammer, is the rhythm output for operating this hammer at a predetermined rhythm. In addition, the output destination of the DO 270 is the measurement object 100. However, if the measurement object 100 is an article such that is machined by a machine tool, for example, it may be configured so as to output the DO 270 to this machine tool.

By simultaneously using the DI 260 and DO 270 while performing high-speed conversion in this way, it is possible to output the data for measurement or testing from the DO 270 to the measurement object 100, measure the response of electrical change in the measurement object 100 relative to the output at the DI 260, and store the digital signal for which the response is synchronized with the output. For example, it becomes possible to convert the positional information of the machine tool into an electrical signal, and monitor other phenomena synchronized with the positional information of the machine tool at high speed.

In addition, each part within the high-speed converter 220 is controlled by the CPU 223 operating at the reference clock as mentioned above. For this reason, for example, a plurality of groups consisting of the DI 261, DIB 262 and DIM 263 are provided, and even in a case of a sensor 210 being connected to each of this plurality of groups, synchronization of the transfer cycle is maintained by the CPU 223.

As explained above, it is possible to maintain the synchronism within the control cycle of the CPU 223 of the AD 240, DA 250, DI 260 and DO 270. In addition, since this processing is processing performed inside of the high-speed converter 220, it is possible to make the control cycle high speed so that one cycle is on the order of 10 μs, for example, without being dependent on the network speed as in Patent Document 1 and Patent Document 2. If an application such as an oscilloscope, it is possible to make the control cycle even higher speed.

In addition, it is possible to connect a plurality of the sensors 210 or a plurality of the measurement objects 100 to the high-speed converter 220 as mentioned above. It may be configured so that the high-speed converter 220 includes a plurality of each of the AD 240, DA 250, DI 260 and DO 270 to handle this. In addition, it may be configured so that a plurality of the AD 240, DA 250, DI 260 and DO 270 are connected for one measurement object 100. Furthermore, for example, it may be configured so as to operate by controlling the measurement object 100 by the DO 270, and measure the phenomenon in the measurement object 100 by the AD 240 rather than the DI 260.

Figure 4:
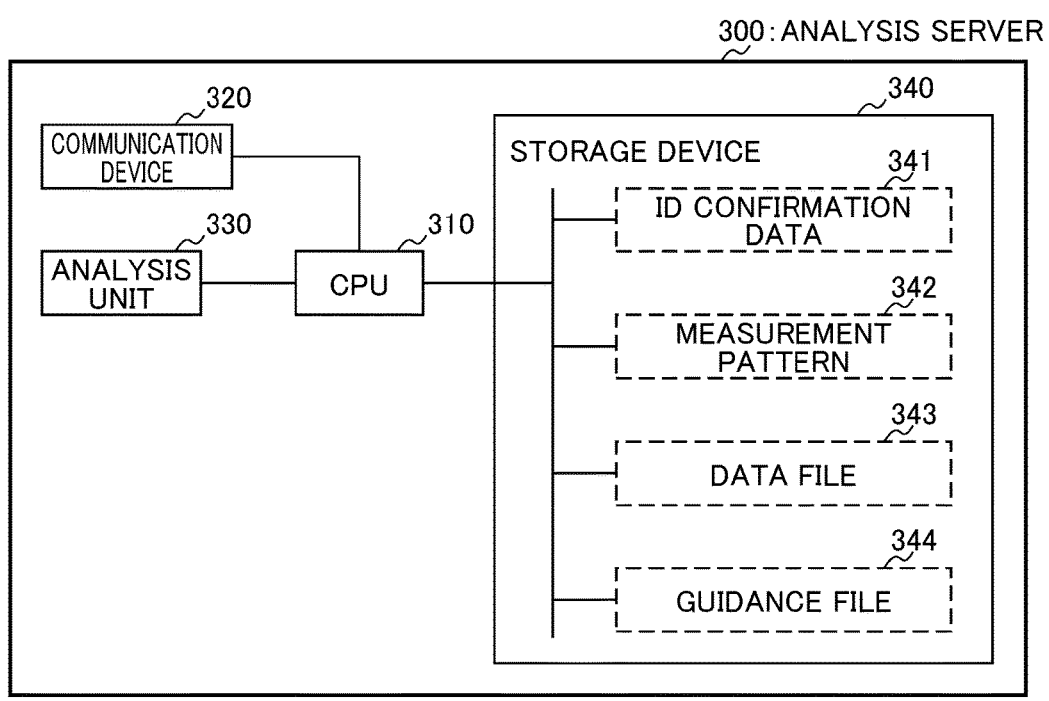
FIG. 4 is a diagram representing the basic configuration of an analysis server according to the embodiment of the present invention.

Next, the configuration of the analysis server 300 will be explained by referencing FIG. 4. The analysis server 300 includes a CPU 310, communication device 320, analysis unit 330 and storage device 340, as shown in FIG. 4.

The CPU 310 is a device that controls the entirety of the analysis server 300. In more detail, the CPU 310 reads information such as control programs stored in the analysis unit 330, etc., and performs arithmetic processing based on the information such as the control programs thus read, etc. Then, by the CPU 310 controlling hardware within the analysis server 300 based on the arithmetic processing, the respective processing of the analysis server 300 is realized. In other words, the analysis server 300 can be realized by hardware and software cooperating.

The communication device 320 is a communication device for performing communication with the high-speed converter 220 via the network 400.

The analysis unit 330 is a portion that analyzes a phenomenon in the measurement object 100 based on the sampling data. More specifically, the sampling data stored in the ADM 243 and DOM 273 is transmitted to the analysis server 300 from the high-speed converter 220 by way of each part of the high-speed converter 220 operating as mentioned above. Then, the analysis unit 300 performs analysis based on this sampling data.

The analysis is performed according to processing based on an analysis sequence corresponding to the type of the measurement object 100 which is the measurement target. For this reason, a plurality of analysis sequences is registered in the analysis unit 330 so as to be able to handle a variety of measurement objects 100. The specific contents of processing based on the analysis sequence will be described later by referencing FIG. 12. According to this analysis, it is possible to perform determination of whether the measurement object 100 is normal, whether an abnormality is occurring in the measurement object 100, etc.

The storage device 340 is a device that stores a variety of information. The storage device 340 stores ID confirmation data 341, measurement patterns 342, a data file 343 and a guidance file 344, for example.

The ID confirmation data 341 is data for performing authentication using the converter ID 232 of the high-speed converter 220. The ID confirmation data 341 is information associating the ID of high-speed converters 220 permitting connection to the analysis server 300, and the authentication password, for example.

The measurement pattern 342 is a measurement pattern stored as the measurement pattern 231 in the storage device 230 of the high-speed converter 220. The specific contents of the measurement pattern 342 will be described later by referencing FIG. 5.

The data file 343 is continuous data stored in the DAM 253 and/or DOM 273 in order to output the DA 250 and/or DO 270. Pluralities of types of the measurement patterns 342 and data files 343 are stored so as to be able to handle various measurement objects 100. Then, the measurement pattern 342 and data file 343 selected based on the type of the measurement object 100 serving as the measurement target are transmitted to the high-speed converter 220.

The guidance file 344 is data for performing guidance to the user. A plurality of types of the guidance files 344 is stored so as to be able to handle various measurement objects 100. The guidance using the guidance file 344 will be described later by referencing FIG. 13.

Next, the specific contents of the measurement pattern 342 will be explained by referencing FIG. 5. Among the items in the "measurement pattern" shown in FIG. 5, the measurement object 1, measurement object 2, . . . measurement object m (m is any natural number) serve as the ID of the measurement object 100 serving as the measurement target. In other words, the measurement pattern is set for every measurement object 100 serving as the measurement target.

The ID of guidance in the guidance file corresponding to the measurement object 100 of each measurement target is stored in the item of "guidance". The CPU 310 can specify the guidance file corresponding to the measurement object 100 serving as the present measurement target, by way of referencing this.

"measurement/output start" is an opportunity to start the measurement and/or output of the high-speed converter 220, and those corresponding to the measurement objects 100 of each measurement target are stored. Herein, measurement is the matter of the high-speed converter 220 converting and storing the AD 240 and DI 260.

In addition, output is the matter of the high-speed converter 220 converting the continuous data and outputting the DA 250 and/or DO 270. If "input signal" among the items, measurement and output are started when the DI 261 in the high-speed converter 220 receives an input signal by the DI 260. In addition, if "setting time" among the items, measurement and output are started when the setting time arrives. In addition, if "AD level" among the items, measurement and output are started when the input level of the AD 240 in the high-speed converter 220 (i.e. analog value) is at least a predetermined level.

"measurement/output time" is the length of time continuing the started measurement and output, and those corresponding to the measurement objects 100 of each measurement target are stored. In the case of within the item of "measurement/output stop" explained next being "time up", "measurement/output time" is stored.

"measurement/output stop" is an opportunity to end the measurement and output of the high-speed converter 220, and those corresponding to the measurement objects 100 of each measurement target are stored. If "input signal" within the items, when the DI 261 of the high-speed converter 220 receives the input signal by the DI 260, the measurement and output come to end. In addition, if "time up" within the item, the measurement and output come to end when a time as long as stored in "measurement/output time" elapses since starting measurement and detection.

In the item of "analysis sequence", the ID of the analysis sequence corresponding to the measurement object 100 of each measurement target is stored. The analysis unit 330 can specify the analysis sequence corresponding to the measurement object 100 serving as the present measurement target, by way of referencing this.

In the item of "DA/DO data number", continuous data corresponding to the measurement object 100 of each measurement target is stored. The continuous data corresponding to the measurement object 100 serving as the current measurement target is stored in the DAM 253 and DOM 273. The continuous data may be either of data for storing in the DAM 253 and outputting the DA 250, or data for storing in the DOM 273 and outputting the DO 270. In addition, although not illustrated in FIG. 5, other than this, information related to measurement and output such as a predetermined sampling time corresponding to the measurement object 100 of each measurement target, and a predetermined dynamic range corresponding to the measurement object 100 of each measurement target is stored.

The various data stored in the storage device 340, etc. can be edited by the user, as explained above. For example, it is possible to make edits by connecting another apparatus to the analysis server 300, and the user performing manipulations by way of this apparatus.

Figure 6:
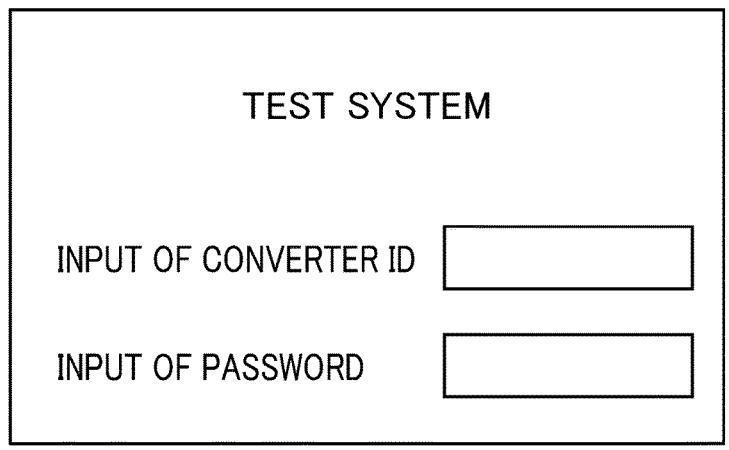
FIG. 6 is a view (1/6) representing an example of a user interface according to the embodiment of the present invention.
Figure 7:
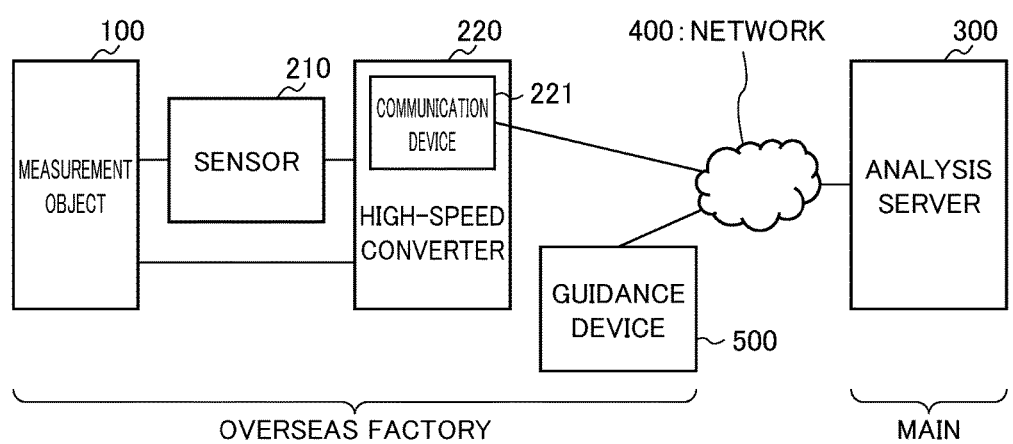
FIG. 7 is a diagram representing a modified example of the overall embodiment of the present invention.

Next, explanations will be made for operations of the high-speed converter 220 and analysis server 300 in the case of actually performing measurement and output. First, it is necessary to specify the measurement object 100 serving as the present measurement target. Therefore, the analysis server 300 performs processing for displaying a user interface such as that shown in FIG. 6. For example, a guidance device 500 is connected to the analysis server 300 via the network 400, etc. as shown in FIG. 7, and the user interface such as that shown in FIG. 6 is displayed on the user interface of this network 400. The guidance device 500 is realized by way of a personal computer, or mobile tablet-type terminal, for example. Hereinafter, it is presented that the analysis server 300 displays by also including the matter of the analysis server 300 performing processing in order to cause display on other equipment such as the guidance device 500.

The user inputs the converter ID which is the ID of the high-speed converter 220 and the password corresponding to this converter ID, by referencing the user interface shown in FIG. 6. The analysis server 300 receives the converter ID and password inputted via the network 400, and performs authentication based on the ID confirmation data 341 stored by itself. If the authentication is successful, the user interface shown in FIG. 8 is displayed. If the authentication fails, this matter is displayed on the user interface, and prompts re-entry. It should be noted that, rather than authenticating the user by allowing the user to input the converter ID and password, it may be configured to receive the converter ID 232 stored by the high-speed converter 220 in place of authentication. If configured in this way, it is possible to eliminate the labor of input by the user.

Next, the user is prompted the selection of an item to measure and input of the ID of an apparatus to measure, on the user interface shown in FIG. 8. First, in order for the user to select the item to be measured, a drop down list such as the shown in FIG. 9 is displayed if selecting the drop down list on the screen top of FIG. 8. The user selects an item corresponding to the measurement target 100 which is an apparatus serving as the present measurement target, from among the items displayed on the drop down list.

Next, the user inputs the ID of the measurement target 100 which is the apparatus serving as the present measurement target, on the screen bottom in FIG. 8 by a keyboard or the like, for example. The ID is the product number of the measurement object 100, for example, and is marked, etc. on the measurement object 100. The user manipulates the transmission button, when these manipulations are completed. The guidance device 500 thereby transmits the measurement item selected and the ID of the measurement object 100 which is the apparatus serving as the measurement target inputted, to the analysis server 300 via the network 400. The analysis server 300 receives the selected measurement item and ID of the measurement object 100 which is the apparatus serving as the measurement target inputted, via the network 400, and specifies the measurement object 100 serving as the present measurement target according to the received ID of the measurement object 100. In this case, if the selected measurement item is a measurement item not corresponding with the specified measurement object 100, since there is a possibility that the user made a mistaken input, this matter is displayed on the user interface to prompt input again.

Figure 10:
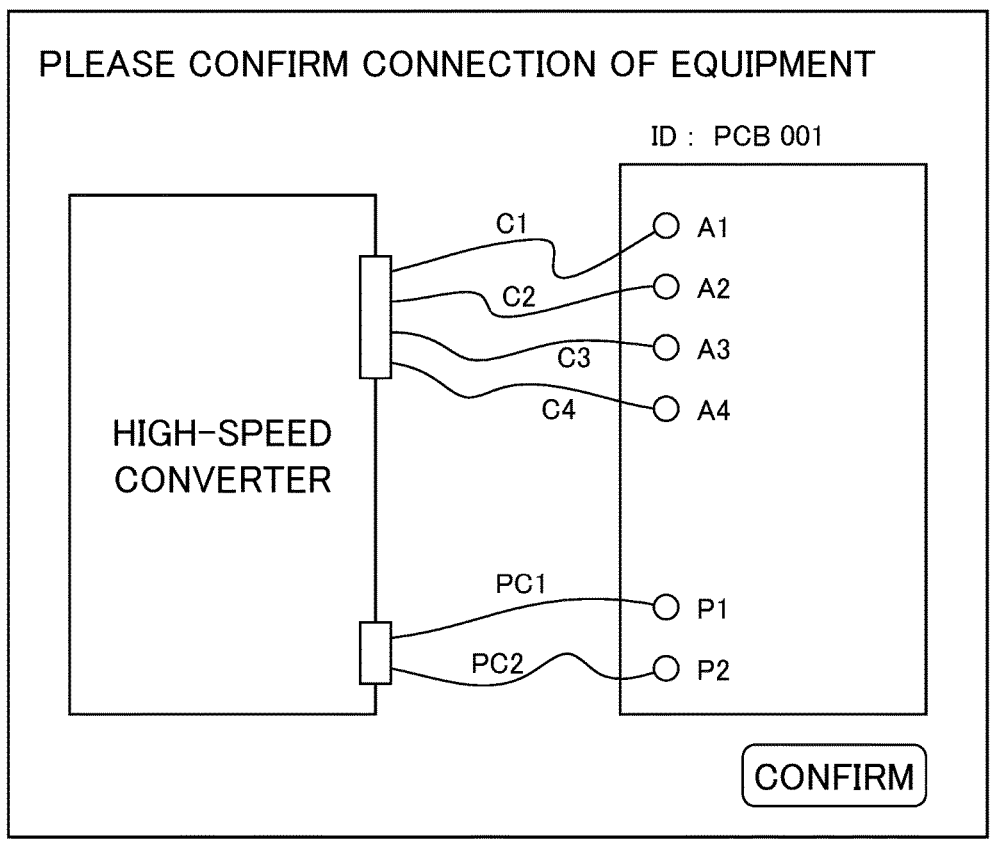
FIG. 10 is a view representing an example of a guidance screen according to the embodiment of the present invention.

Next, the analysis server 300 specifies the ID of the guidance file corresponding to the specified measurement object 100, by referencing the measurement pattern 342. Then, the guidance file corresponding to the ID of this specified guidance file is acquired from the guidance file 344. Then, according to the acquired guidance file, a screen for guidance such as that of FIG. 10 is displayed. Then, the user connects the measurement object 100 serving as the measurement target and the high-speed converter 220, while referencing this screen for guidance. The user can perform connection easily by performing graphical display in this way. Herein, in the present example, an explanation is made with the measurement object 100 assuming the example of a printed substrate (PCB: Printed Circuit Board).

PC1 and PC2 in the drawings are cables for power supply in the drawing, and it is found to be sufficient to connect these to P1 or P2, which are the corresponding terminals of the printed substrate, respectively. In addition, from C1 until C2 is a cable for transmitting signals, and it is found to be sufficient to connect this to from A1 to A4, which are the corresponding terminals of the printed substrate, respectively. It should be noted that the signal outputted from the high-speed converter 220 via C1 and C2 to the printed substrate corresponds to DA 250, for example. In addition, the signal outputted from the printed substrate to the high-speed converter 220 via C3 and C4 corresponds to DO 270. Some printed substrates may have a test circuit whereby a predetermined output voltage is outputted when applying a predetermined test voltage thereto. In such a case, it is possible to perform testing using the test circuit if performing connections such as those in FIG. 10.

Figure 11:
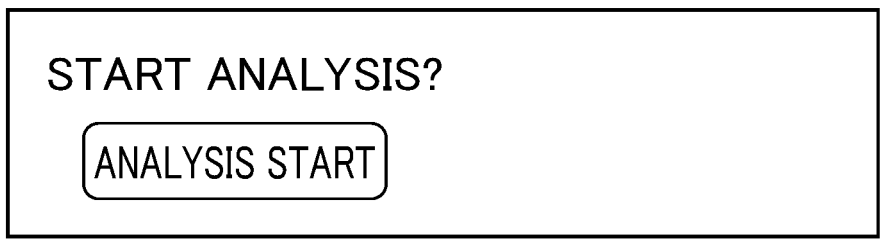
FIG. 11 is a view (4/6) representing an example of the user interface according to the embodiment of the present invention.

The user manipulates a confirmation button, when appropriately connecting the high-speed converter 220 and measurement object 100, by referencing the guidance screen of FIG. 10. The guidance device 500 thereby transmits the fact that the confirmation button was manipulated to the analysis server 300 via the network 400. The analysis server 300 displays a screen for confirming whether to start analysis as shown in FIG. 11, when receiving the fact that the confirmation button was manipulated via the network 400.

On this screen, the user manipulates the analysis start button. The guidance device 500 thereby transmits the fact that the analysis start button was manipulated to the analysis server 300 via the network 400. When the analysis server 300 receives the fact that the analysis start button was manipulated via the network 400, the analysis unit 330 specifies the analysis sequence corresponding to the measurement object 100 serving as the measurement target, by referencing the measurement pattern 342. Then, the processing according to the specified analysis sequence is started.

Figure 12:
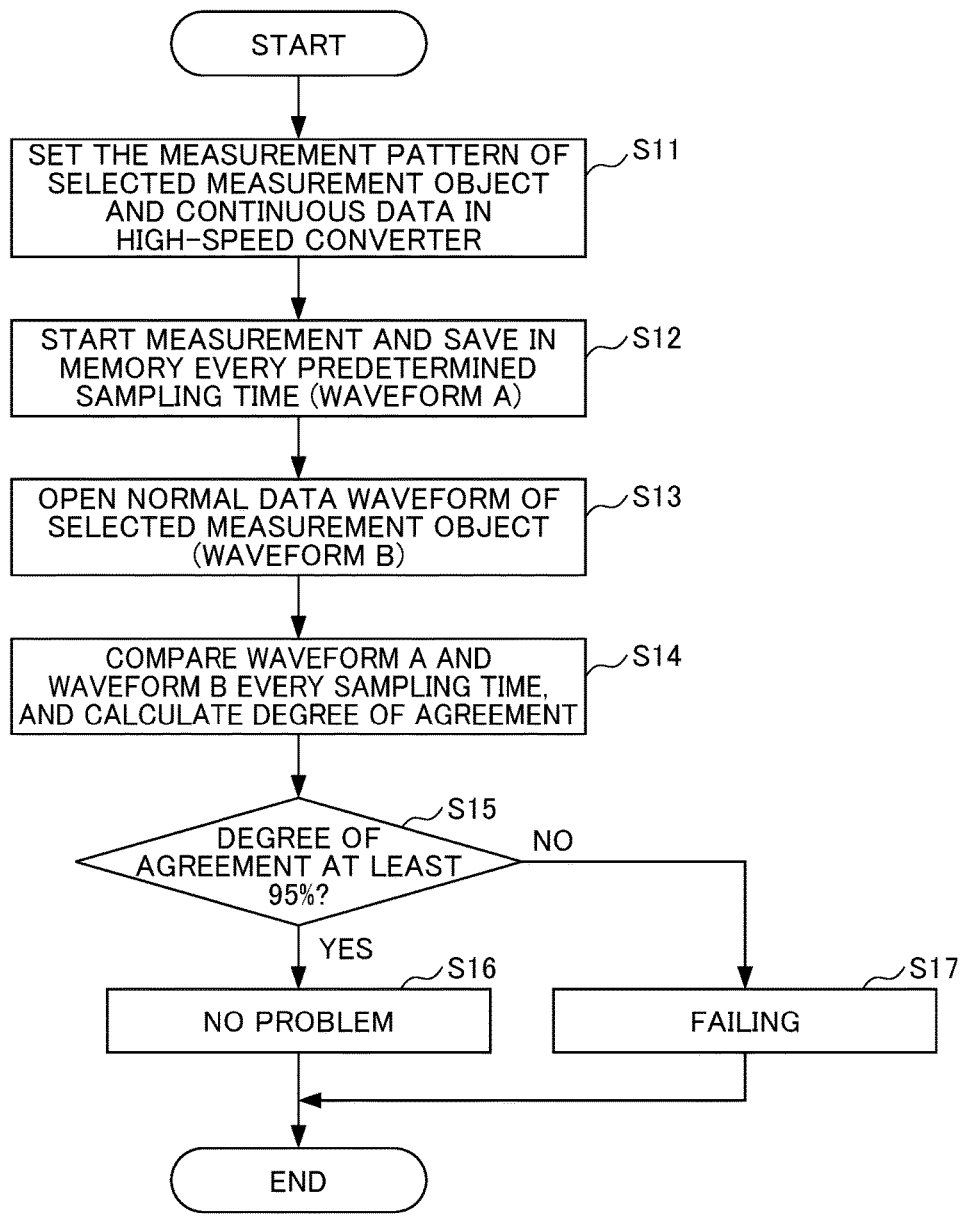
FIG. 12 is a flowchart representing the processing by an analysis sequence according to the embodiment of the present invention.

An explanation for the processing according to the analysis sequence will be made by referencing FIG. 12. First, by referencing the measurement pattern 342, the measurement pattern corresponding to the measurement object 100 serving as the measurement target is acquired from the measurement pattern 342. In addition, the continuous data corresponding to the measurement object 100 serving as the measurement target is acquired from the data file 343. Then, the acquired measurement pattern and continuous data are transmitted to the high-speed converter 220. The high-speed converter 220 having received these performs setting by way of storing the received measurement pattern in the storage device 230 as the measurement pattern 231. In addition, setting is performed by way of storing the received continuous data in the DAM 253 and/or DOM 273 (Step S11).

Next, measurement is started based on the measurement pattern and continuous data set in Step S11 by the high-speed converter 220. Since the operations of the high-speed converter 220 during measurement are already explained by referencing FIG. 5, detailed explanation will be omitted. Then, every sampling time based on the set measurement pattern, the sampling data obtained from measurement is saved in the ADM 243 and/or DIM 263 (Step S12). When the measurement ends, the sampling data saved in the ADM 243 and/or DIM 263 is transmitted to the analysis server 300 from the high-speed converter 220. The waveform reproduced by this sampling data is called "waveform A" in the following explanation.

Next, when the analysis server 300 receives sampling data from the high-speed converter 220, the storage device 230 opens the waveform reproduced by the normal data for performing analysis (called "waveform B" in the following explanation) (Step S13). Herein, waveform B, in the case of the measurement object 100 serving as the present measurement target operating normally, is the waveform reproduced by the sampling data (i.e. normal data) obtained in the case of performing measurement as in Step S11 and Step S12 on this measurement object 100. The waveform B shall be included as a part of the data of the analysis sequence.

Next, the storage device 230 compares the waveform A and waveform B at every sampling time, and calculates the degree of agreement for every sampling time, respectively. In this case, if the waveform A and waveform B are waveforms expressed by 0 or 1, for example, the degree of agreement will be 1 if the waveform A and waveform B are both 1 or both 0, and the degree of agreement will be zero if not as such. In addition, if the waveform A and waveform B are waveforms expressed by digital values, for example, the degree of agreement will be 0.9 if the value of the digital value of one waveform is 10, and the value of the digital value of the other waveform is 9.

Then, the average of the degree of agreement for every sampling time computed by the calculation is computed as the degree of agreement between the waveform A and waveform B (Step S14).

Figure 13:
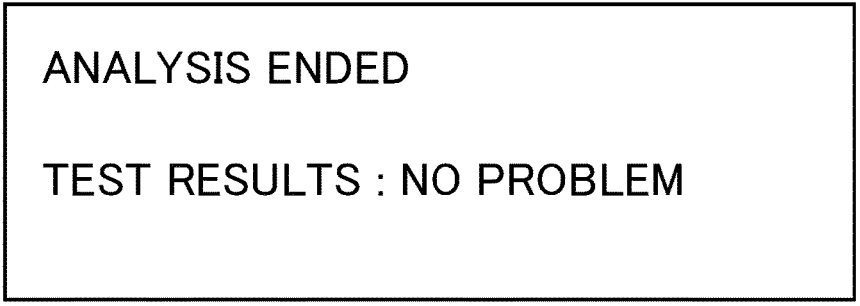
FIG. 13 is a view (5/6) representing an example of a user interface according to the embodiment of the present invention.

In the case of expressing the degree of agreement computed in this way by percentage, if being 95 percent or higher (YES in Step S15), it will be an analysis result of no problem in the measurement object 100 serving as the measurement target (Step S16). In this case, display expressing the fact of there not being a problem is performed, as shown in FIG. 13, for example.

Figure 14:
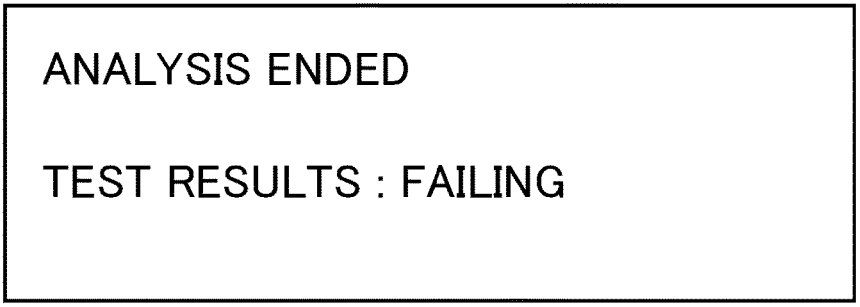
FIG. 14 is a view (6/6) representing an example of a user interface according to the embodiment of the present invention.

On the other hand, if less than 95 percent (NO in Step S15), it will be an analysis result of the measurement object 100 serving as the measurement target having failed (Step S17). In this case, display expressing the fact that there is a problem is performed as shown in FIG. 14, for example. It should be noted that, in the above explanation, although determination was made with the reference of 95 percent, making 95 percent as the reference is merely an exemplification. Determination may be performed with a value other than 95 percent as the reference, or determination may be performed with another reference. In addition, analysis may be performed further using a method such as principal component analysis, for example.

Explanations for the configurations and operations of the present embodiment have been made above. Such an embodiment as the present exerts many effects. In this regard, the configurations for Patent Documents 1 and 2 will be explained in further detail, and an explanation for the effects of the present embodiment will be made while comparing with these.

In the configuration of Patent Document 1, since an analog signal is converted to digital data, and the conversion results are stored in a data server connected by network, there has been a problem in that processing at a high-speed sampling period of at least the network speed is difficult. In addition, there has been a problem in that synchronous processing at high speed of a plurality of analog signals is not possible.

In the configuration of Patent Document 2, the measurement instrument with communication function (A), monitoring terminal (B) and diagnostic device (C) are connected via a network. In this point, the measurement instrument with communication function (A) includes a measurement sensor, A/D converter, measurement control means and communication device. However, the measurement sensor has a problem in requiring the provision of a measurement instrument with communication function equipped with a different sensor according to the measurement target. In addition, communication with a different measurement instrument with communication function (A) has the problem not only in the network, but also in that acquiring a plurality of synchronized data at a high-speed sampling cycle is difficult. Furthermore, the measurement control means of the measurement instrument with communication function (A) is controlled at the measurement cycle sent from the monitoring terminal (B), the measurement cycle is every several minutes, several hours, day, for example, it is possible to freely set the measurement time, etc. as well, and there has been a problem in that knowledge related to measurement is required in order to set the correct conditions. Furthermore, due to the monitoring terminal (B) being an arrangement that has a measurement processing means used in the measurement instrument with communication function (A), and a diagnostic condition designating means, display device, communication device, etc. related to the diagnostic device (C), transmits the results measured at the measurement instrument (A) by the measurement processing means to the diagnostic device (C), receives the results of diagnosing with the diagnostic device (C) by the diagnostic condition designating means at the monitoring terminal (B), and diagnosis, there has been a problem in that the system is not established unless manipulating the measurement processing means and information processing means at this monitoring terminal.

The above problems are summarized as the following (1) to (3).

(1) According to the measurement target, there are cases in which it is important to simultaneously monitor two targets, and thus synchronism of a plurality of measured signals is important; however, it has been difficult to synchronize a plurality of signals at high speed. However, according to the present embodiment, in addition to a plurality of signals measured, the CPU 223 performs input/output based on the clock outputted by the clock generation circuit 222 for a plurality of signals outputted. The effect is exerted in that it is possible to synchronize a plurality of signals at high speed. In other words, according to the present embodiment, it is possible to solve the problem of the above-mentioned (1).

(2) The sensors are often directly installed to the measurement target, and often fail due to the installation environment of the measurement target. Generally, a sensor using a network is configured by a sensor part, conversion part that converts sensor information into digital data, and a communication part that communications with the network. In the case of the sensor part, conversion part and communication part being designed as one body as is conventionally, it has been necessary to replace the entirety, including the portions not failing, during failure of the sensor part. However, according to the present embodiment, since the sensor 210 and high-speed converter 220 are realized as individual devices, it is possible to connect and disconnect any type and any number of sensors 210 to the high-speed converter 220. For this reason, it exerts an effect in that it is not necessary to replace other portions, even in a case of the sensor part failing. In other words, according to the present embodiment, it is possible to solve the problem of the above (2).

(3) The uses of the measurement apparatuses are a vast range, and the cases of being used also by persons without special knowledge are increasing. Conventionally, the connection between the measurement target and sensor, etc., is conducted by a technician with expert knowledge referencing some manuals. However, according to the present embodiment, it is possible to provide an easily understood user interface such as those shown in FIGS. 6 to 11 to the user. Furthermore, with the present embodiment, in the case of connection confirmation between the high-speed converter 220 and measurement object 100 being necessary, it is possible to provide a connection confirmation screen such as that shown in FIG. 13 to the user. Additionally, since the measurement pattern is prepared in advance for every measurement object 100 serving as a measurement target, it is also unnecessary for the user to input parameters, etc. related to sampling. Therefore, the present embodiment exerts an effect in that high-grade measurement is easily possible by anyone. In other words, according to the present embodiment, it is possible to solve the problem of the above (3).

In addition, other than this, for example, due to performing authentication using the converter ID, the present embodiment also exerts the effect in that it is possible to maintain security since the analysis server 300 can be configured so as only to connect with permitted high-speed converters 220.

It should be noted that the aforementioned embodiment is a preferred embodiment of the present invention; however, it is not to limit the scope of the present invention to only the above-mentioned embodiment, and implementation in modes established by conducting various modifications within a scope not departing from the gist of the present invention is possible. For example, in the aforementioned embodiment, an explanation was made with a device performing measurement. However, a configuration in which measurement is not essential is also considered. Such a configuration will be explained by referencing FIG. 15.

In the present example, processing is performed with the device causing a hammer to operate as the target. Such a device includes a hammer mechanism 710, electromagnet 720, hammer 730, spring 740, sample 750 and electrical circuit 760.

The DO 271 is connected to the electrical circuit 760, and the DO 270 outputted by the DO 271 is inputted to the electrical circuit 760. When referencing the bottom of FIG. 15 regarding this point, the DO 271 performs conversion on the continuous data inputted from the DOB 272 (i.e. digital signal expressing 0 or 1), and outputs the DO 270 which is the OFF level (i.e. low level) when the continuous data becomes 0, and which is the ON level (i.e. high level) when the continuous data is 1.

The hammer 730 is retained by the hammer mechanism 710, which is a mechanism capable of driving the hammer 730 vertically. Then, in the case of the DO 270 being the OFF level, the hammer 730 is at the position represented by the dotted line according to the elastic force of the spring 740. In this case, the hammer 730 and sample 750 are not contacting. On the other hand, the electrical circuit 760 turns ON the electromagnet 720 when the DO 270 becomes the ON level. Then, when the magnetic force generated by this electromagnet 720 exceeds the elastic force of the spring 740, the hammer 730 is drawn towards the solenoid 720. The hammer 730 thereby contacts the sample 750. By configuring in this way, it is possible to drive a device such that adjusts the contact time between the sample 750 and hammer 730 according to the continuous data stored in the DOM 273. In this case, it is also possible to realize this device as a shoulder tapping machine, for example.

In addition, it may be configured so as to perform further measurement by such a device. For example, if measuring the sample 750 by a sensor 210 such that measures the state of the sample 750, it is possible to examine the influence on the sample 750 from the sample 750 and hammer 730 contacting.

Figure 16:
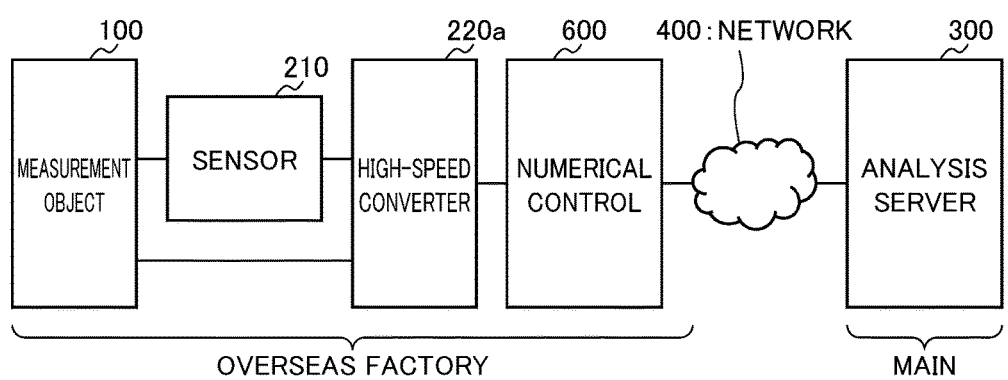
FIG. 16 is a diagram representing a modified example of the overall embodiment of the present invention.

Next, as another configuration, a configuration such that realizes the functions of the guidance device 500 and communication device 221 in a device other than the high-speed converter 220, and eliminates the function of the communication device 221 from the high-speed converter 220 will also be considered. Such a configuration will be explained by referencing FIG. 16. More specifically, instead of the high-speed converter 220a made by modifying the high-speed converter 220 not having the communication device 221, it is connected by a cable compliant with the USB standard, for example, with the numerical control 600 to transmit/receive data. Then, the numerical control 600 performs communication with the analysis server 300 via the network 400, instead of the communication device 200. If configured in this way, it is not necessary to replace the entirety of the high-speed converter 220 irrespective of only the communication device 221 failing. Herein, the numerical control 600 is a numerical control for a machine tool (CNC: Computer Numerical Control) installed in a factory.

However, instead of the numerical control 600, it may be configured so that a personal computer or portable tablet-type terminal is connected to the high-speed converter 220a, and this personal computer or portable tablet-type terminal performs communication with the analysis server 300 via the network 400 instead of the communication device 221.

Figure 17:
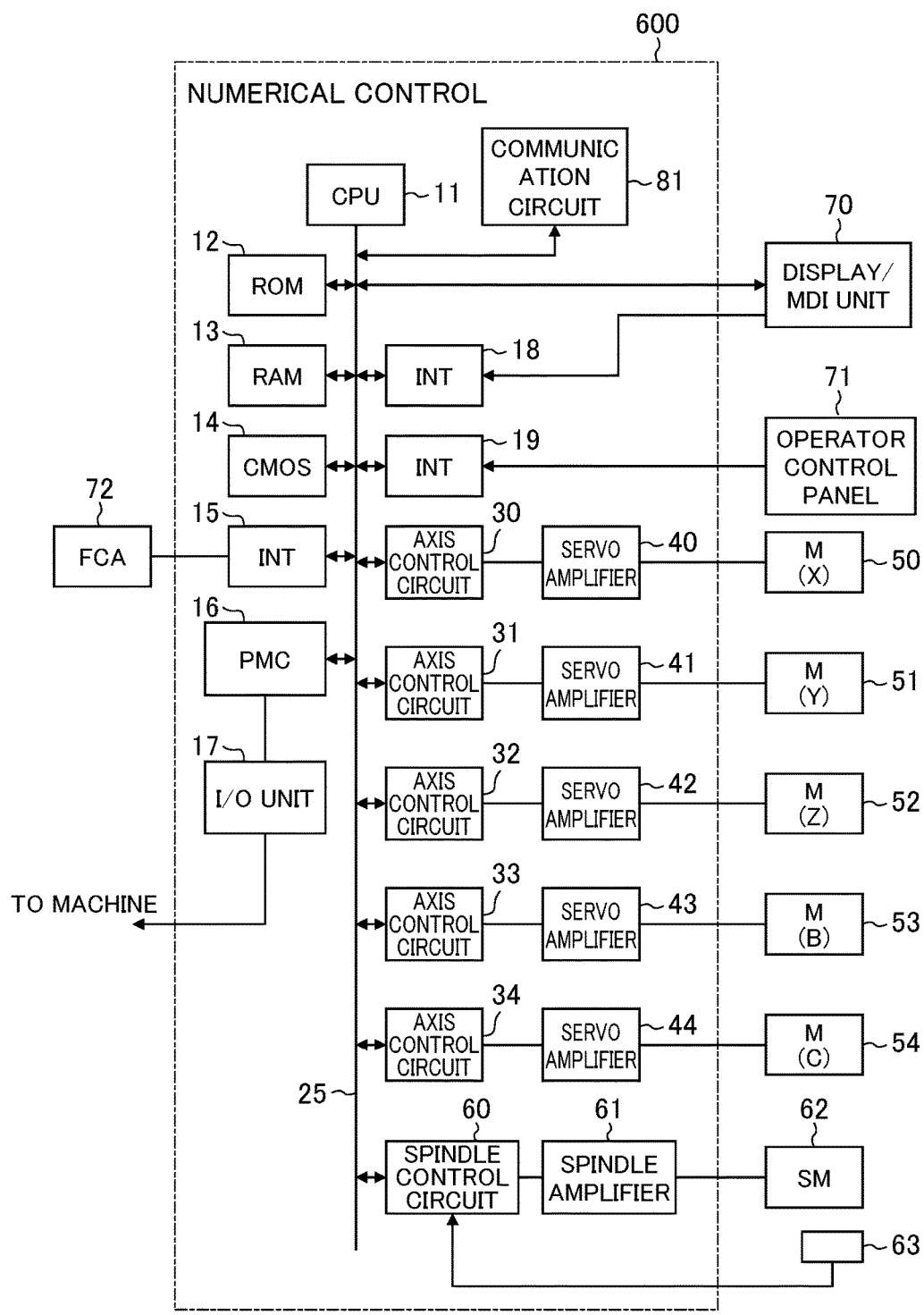
FIG. 17 is a diagram representing the configuration of a numerical control according to the embodiment of the present invention.

Hereinafter, the configuration of the numerical control 600 will be explained by referencing FIG. 17. When referencing FIG. 17, the numerical control 600 includes a CPU 11, ROM 12, RAM 13, CMOS memory 14, interface 15, PMC 16, I/O unit 17, interface 18, interface 19, data communication bus 25, axis control circuits 30 to 34, servo amplifiers 40 to 44, servomotors 50 to 54, spindle control circuit 60, spindle amplifier 61, spindle motor 62, pulse encoder 63, display/MDI unit 70, external equipment 72 and communication circuit 81. Hereinafter, each of these functional blocks will be explained.

The CPU 11 is a processor that controls the entirety of the numerical control 600. The CPU 11 reads system programs stored in the ROM 12 via the bus 25, and controls the entirety of the numerical control according to these system programs. Temporary calculated data or display data, and various data inputted by the operator via the display/MDI unit 70 are stored in the RAM 13. In addition, it is possible to store positional information and command data for servomotors, or load current data, etc. at high speed in the RAM 13.

The CMOS memory 14 is configured as non-volatile memory that is backed up by a battery (not illustrated), and the storage state is retained even if the power source of the numerical control 600 is turned OFF. In the CMOS memory 14, a machining program read via the interface 15, a machining program inputted via the display/MDI unit 70, or the like are stored. In the ROM 12, various system programs for conducting processing of editing mode necessitated for creation and editing of machining programs, and processing for automatic operation are written in advance in the ROM 12.

Various machining programs such as the machining programs executing the present invention can be inputted via the interface 15 or display/MDI unit 70, and stored in the CMOS memory 14.

The interface 15 shall enable connection between the numerical control 600 and external equipment 72 such an adapter. Machining programs, various parameters, etc. are read from the side of the external equipment 72. In addition, the machining program edited within the numerical control 600 can be stored in an external storage means via the external equipment 72.

PMC (programmable machine controller; note: generally called PLC programmable logic controller) 16 outputs signals via the I/O unit 17 to control a slave device of a machine tool (e.g., actuator like a robot hand for tool exchange) by a sequence program built into the numerical control 600.

In addition, the signals of various switches on the operator control panel stationed at the main body of the machine tool are received, and after doing the necessary signal processing, handed over to the CPU 11.

The display/MDI unit 70 is a manual data input device including a display, keyboard, etc., and the interface 18 receives the command or data from the keyboard for the display/MDI unit 70 and hands over to the CPU 11. The interface 19 is connected to the operator control panel 71 including a manual pulse generator and the like.

The axis control circuits 30 to 34 for each axis receive the movement command value for each axis from the CPU 11, and output the command for each axis to the servo amplifiers 40 to 44. The servo amplifiers 40 to 44 receive these commands and drive the servomotors 50 to 54 of each axis. The servomotors 50 to 54 of each axis have built-in position/velocity detectors, and feedback the position/velocity feedback signals from these position/velocity detectors to the axis control circuits 30 to 34 to perform position/velocity feedback control. It should be noted that position/velocity feedback is omitted in the block diagrams.

The spindle control circuit 60 receives a spindle rotation command for the machine tool, and outputs a spindle speed signal to the spindle amplifier 61. The spindle amplifier 61 receives this spindle velocity signal, causes the spindle motor 62 of the machine tool to rotate at the commanded rotation speed to drive the tool.

The pulse encoder 63 is connected by gears or a belt to the spindle motor 62, and the pulse encoder 63 outputs a return pulse synchronously with the rotation of the spindle, and this return pulse is read by the processor 11 through the bus 20.

The communication circuit 81 is a communication circuit for connecting the numerical control 600 and analysis server 300, so that the numerical control 600 can communication via the network 400 with the analysis server 300. The communication circuit 81 has a similar communication function as the communication device 221 of the aforementioned embodiment.

It should be noted that the above-mentioned high-speed converter or measurement system including the high-speed converter can be realized by way of hardware, software or a combination thereof. In addition, a high-speed conversion method performed by the above-mentioned high-speed converter or measurement system including the high-speed converter can also be realized by way of hardware, software or a combination thereof. Herein, realizing by way of software indicates the matter of being realized by a computer reading and executing programs.

The programs can be stored using various types of non-transitory computer readable media and provided to a computer. The non-transitory computer readable media includes various types of tangible storage media. Examples of non-transitory computer-readable recording media include magnetic media (for example, flexible disk, magnetic tape, hard disk drive), magneto-optical recording media (for example, magneto-optical disk), CD-ROM (Read Only Memory), CD-R, CD-R/W, and semiconductor memory (for example, mask ROM, PROM (Programmable ROM), EPROM (Erasable PROM), flash ROM, RAM (random access memory)). In addition, programs may be provided to the computer by way of various types of transitory computer readable media. Examples of transitory computer readable media include electrical signals, optical signals, and electromagnetic waves. The transitory computer readable media can provide programs to the computer via a wired communication path such as electrical lines or optical fiber, or a wireless communication path.

INDUSTRIAL APPLICABILITY

The present invention is widely suited to the conversion of signals, irrespective of the application such as a measurement purpose.

EXPLANATION OF REFERENCE NUMERALS

11 CPU
12 ROM
13 RAM
14 CMOS memory
15, 18, 19 interface
16 PMC
17 I/O unit
20 measurement device
21 sensor
22 conversion part
23 communication device
25 data communication bus
30~34 axis control circuit
40~44 servo amplifier
50~54 servomotor
60 spindle control circuit
61 spindle amplifier
62 spindle motor
63 pulse encoder
70 display/MDI unit
71 operator control panel
72 external equipment
81 communication circuit
100 measurement object
210 sensor
220, 220a high-speed converter 221 communication device
223 CPU
230 storage device
231 measurement pattern
232 converter ID
240 AD
241 A/D
242 ADB
243 ADM
250 DA
251 D/A
252 DAB
253 DAM
260, 261 DI
262 DIB
263 DIM
270, 271 DO
272 DOB
273 DOM
300 analysis server
310 CPU
320 communication device
330 analysis unit
340 storage device
341 ID confirmation data
342 measurement pattern
343 data file
344 guidance file
400 network
500 guidance device
600 numerical control
710 hammer machine
720 electromagnet
730 hammer
740 spring
750 sample
760 electrical circuit

What is claimed is:

1. A high-speed converter comprising:
    at least one converter from among: an analog to digital converter for converting an analog signal into a digital value; a digital to analog converter for converting a digital value into an analog signal; an electrical to digital converter for converting an electrical signal into a digital signal; and a digital to electrical converter for converting a digital signal into an electrical signal,
    wherein the at least one converter is operated by a method based on information acquired via a network;
    wherein the information acquired via the network comprises data for measuring a measurement object, and
    wherein the at least one converter converts and outputs the data for measuring, while a converter other than said at least one converter converts data inputted from a measurement instrument that is measuring the measurement object.

2. The high-speed converter according to claim 1, further comprising:
    a plurality of converters from among the analog to digital converter, the digital to analog converter, the electrical to digital converter, and the digital to electrical converter; and
    a clock generation circuit for generating a clock,
    wherein the plurality of converters are operated synchronously based on the clock outputted from the clock generation circuit.

3. The high-speed converter according to claim 1, wherein the information acquired via the network further includes a condition for starting measurement on the measurement object and a condition for ending measurement on the measurement object, and
    wherein measurement on the measurement object is started based on the condition for starting being satisfied, and subsequently the measurement on the measurement object is ended based on the condition for ending being satisfied.

4. The high-speed converter according to claim 1, wherein the data for measuring the measurement object is data for inducing a predetermined phenomenon in the measurement object.

5. The high-speed converter according to claim 1, wherein the high-speed converter is capable of connecting and disconnecting the measurement instrument and switching to another measuring instrument.

6. A measurement system comprising:
    the high-speed converter according to claim 1, and
    an analysis server that is connected to the high-speed converter via the network,
    wherein the analysis server transmits at least the data for measuring the measurement object to the high-speed converter as the information acquired via the network,
    wherein the high-speed converter measures the measurement object by causing conversion to be performed in the at least one converter based on the data for measuring the measurement object, and transmits data acquired from the measurement to the analysis server, and
    wherein the analysis server performs analysis on the measurement object based on the data inputted from the measurement instrument that is measuring the measurement object.

7. The measurement system according to claim 6, wherein the analysis server outputs guidance information corresponding to a type of the measurement object, the guidance information being referenced by a user in order to perform measurement.

8. A non-transitory computer-readable medium encoded with a high-speed conversion program for enabling a computer to function as a high-speed converter,
    wherein the computer comprises at one converter from among: an analog to digital converter for converting an analog signal into a digital value; a digital to analog converter for converting a digital value into an analog signal; an electrical to digital converter for converting an electrical signal into a digital signal; and a digital to electrical converter for converting a digital signal into an electrical signal,
    wherein the high-speed conversion program operates the at least one converter by a method based on information acquired via a network;
    wherein the information acquired via the network comprises data for measuring a measurement object, and
    wherein the high-speed conversion program causes the at least one converter to convert and output the data for measuring, while a converter other than said at least one converter converts data inputted from a measurement instrument that is measuring the measurement object.

* * * * *